United States Patent
Nishigaki et al.

(10) Patent No.: US 11,189,863 B2
(45) Date of Patent: Nov. 30, 2021

(54) POWER STORAGE APPARATUS

(71) Applicant: KABUSHIKI KAISHA TOYOTA JIDOSHOKKI, Aichi (JP)

(72) Inventors: Kenji Nishigaki, Kariya (JP); Junichi Hatano, Kariya (JP); Toshio Otagiri, Kariya (JP); Hiroto Sato, Kariya (JP); Shinichi Aizawa, Kariya (JP); Ryusuke Hase, Kariya (JP)

(73) Assignee: KABUSHIKI KAISHA TOYOTA JIDOSHOKKI, Aichi (JP)

( * ) Notice: Subject to any disclaimer, the term of this patent is extended or adjusted under 35 U.S.C. 154(b) by 214 days.

(21) Appl. No.: 16/326,514

(22) PCT Filed: Jul. 14, 2017

(86) PCT No.: PCT/JP2017/025731
§ 371 (c)(1),
(2) Date: Feb. 19, 2019

(87) PCT Pub. No.: WO2018/037761
PCT Pub. Date: Mar. 1, 2018

(65) Prior Publication Data
US 2019/0207271 A1    Jul. 4, 2019

(30) Foreign Application Priority Data
Aug. 26, 2016    (JP) .............................. JP2016-166199

(51) Int. Cl.
*H01M 10/44* (2006.01)
*G01R 31/3835* (2019.01)
(Continued)

(52) U.S. Cl.
CPC ............ *H01M 10/44* (2013.01); *G01R 31/36* (2013.01); *G01R 31/3835* (2019.01);
(Continued)

(58) Field of Classification Search
CPC .... H01M 10/44; H01M 10/48; H01M 10/486; G01R 31/3835; G01R 31/36; H02J 7/00; H02J 7/007
(Continued)

(56) References Cited

U.S. PATENT DOCUMENTS 8,552,693 B2 * 10/2013 Paryani ............ H02J 7/007194
320/152
10,090,686 B2   10/2018 Suzuki
(Continued)

FOREIGN PATENT DOCUMENTS

JP     2009-234557 A    10/2009
JP     2014-132243 A    7/2014
(Continued)

OTHER PUBLICATIONS

International Search Report, dated Sep. 26, 2016, in International Application No. PCT/JP2017/025731.
(Continued)

Primary Examiner — Richard Isla
Assistant Examiner — Dung V Bui
(74) Attorney, Agent, or Firm — Greenblum & Bernstein, P.L.C.

(57) ABSTRACT

A power storage apparatus including a battery and a control circuit that controls the charging or discharging of the battery, wherein during a polarization elimination time period extending from the charging/discharging end time of the battery to a polarization-eliminated time at which polarization of the battery can be judged to have been eliminated, the control circuit obtains, as an amount of change, the difference between a voltage measured at a first time set according to the temperature of the battery and a voltage measured at a second time following the first time and set according to the temperature of the battery, and sums the
(Continued)

product of the amount of change and an estimation coefficient and the voltage measured at the first or second time so as to estimate an open-circuit voltage of the battery to be provided after elimination of the polarization of the battery.

9 Claims, 8 Drawing Sheets

(51) Int. Cl.
  *H01M 10/48* (2006.01)
  *H02J 7/00* (2006.01)
  *G01R 31/36* (2020.01)
(52) U.S. Cl.
  CPC ......... *H01M 10/48* (2013.01); *H01M 10/486* (2013.01); *H02J 7/00* (2013.01); *H02J 7/007* (2013.01)
(58) Field of Classification Search
  USPC ......................................................... 320/132
  See application file for complete search history.

(56) References Cited

U.S. PATENT DOCUMENTS

| | | | | |
|---|---|---|---|---|
| 2002/0014879 | A1* | 2/2002 | Koike | H02J 7/0069 320/133 |
| 2004/0008031 | A1* | 1/2004 | Arai | H01M 10/48 324/429 |
| 2008/0065336 | A1* | 3/2008 | Seo | G01R 19/16542 702/63 |
| 2009/0033290 | A1* | 2/2009 | Tomura | G01R 31/367 320/149 |
| 2009/0230766 | A1* | 9/2009 | Miyama | H02J 7/1423 307/10.7 |
| 2010/0072951 | A1* | 3/2010 | Nakashima | H02J 7/00711 320/145 |
| 2011/0084702 | A1* | 4/2011 | Mori | H01M 10/441 324/430 |
| 2011/0264381 | A1* | 10/2011 | Gering | H01M 10/48 702/32 |
| 2012/0130661 | A1* | 5/2012 | Hagimori | H02J 7/0071 702/63 |
| 2012/0310565 | A1* | 12/2012 | Redey | G01R 31/367 702/63 |
| 2013/0080096 | A1* | 3/2013 | Toki | G01R 31/389 702/63 |
| 2014/0214349 | A1* | 7/2014 | Dong | G01R 31/392 702/63 |
| 2014/0225621 | A1 | 8/2014 | Kimura et al. | |
| 2015/0369875 | A1* | 12/2015 | Ishii | G01R 31/382 702/63 |
| 2016/0089994 | A1* | 3/2016 | Keller | H02J 7/007194 320/153 |
| 2017/0005488 | A1* | 1/2017 | Suzuki | G01R 31/367 |
| 2017/0363690 | A1* | 12/2017 | Kawamura | G01R 31/382 |
| 2019/0004115 | A1* | 1/2019 | Nakamura | G01R 31/3828 |

FOREIGN PATENT DOCUMENTS

| | | |
|---|---|---|
| JP | 2015-081855 A | 4/2015 |
| JP | 2015-114105 A | 6/2015 |
| JP | 2016-065844 A | 4/2016 |
| JP | 2016-139525 A | 8/2016 |

OTHER PUBLICATIONS

Written Opinion of the International Searching Authority, dated Sep. 26, 2017, in International Application No. PCT/JP2017/025731 (including partial English language translation).

* cited by examiner

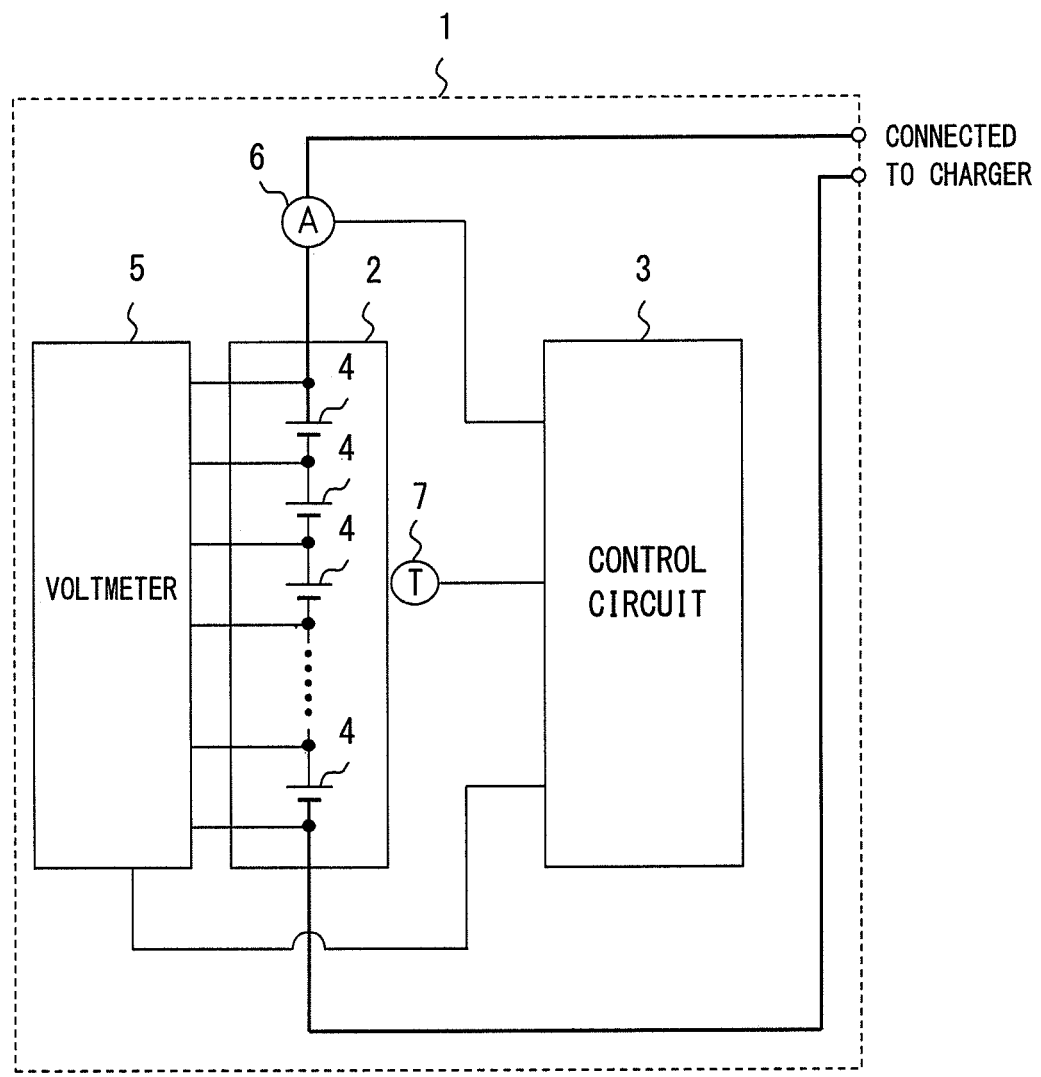
F I G. 1

POWER STORAGE APPARATUS

TECHNICAL FIELD

The present invention relates to a power storage apparatus that estimates an open-circuit voltage fora battery.

BACKGROUND ART

Regarding a polarization elimination time period extending from a battery charging/discharging end time to a polarization-eliminated time at which polarization of the battery can be judged to have been eliminated, a known method of estimating an open-circuit voltage (OCV) to be provided after the elimination of the polarization is a method of estimating the voltage using a temporal variation in the voltage of the battery during the polarization elimination time period after the end of the charging or discharging.

Related techniques include the techniques described in patent literatures 1 and 2.

CITATION LIST

Patent Literature

Patent literature 1: Japanese Laid-open Patent Publication No. 2014-132243
Patent literature 2: Japanese Laid-open Patent Publication No. 2016-065844

SUMMARY OF INVENTION

Technical Problem

However, the polarization elimination time period of a battery is varied with a battery temperature, and hence the temporal change in the voltage of the battery is also varied with the battery temperature. Accordingly, an estimation accuracy would be decreased if an open-circuit voltage to be provided after elimination of polarization is not estimated according to the battery temperature.

An object in accordance with an aspect of the present invention is to provide a power storage apparatus that increases an accuracy in the estimation of an open-circuit voltage to be provided after elimination of polarization.

Means for Solving the Problems

A power storage apparatus in accordance with one mode of the invention includes a battery and a control circuit that controls the charging or discharging of the battery.

During a polarization elimination time period extending from a battery charging/discharging end time to a polarization-eliminated time at which polarization of a battery can be judged to have been eliminated, the control circuit obtains, as an amount of change, the difference between a voltage measured at a first time set according to a battery temperature and a voltage measured at a second time following the first time and set according to the battery temperature, and sums the product of the amount of change and an estimation coefficient and the voltage measured at the first or second time so as to estimate an open-circuit voltage of the battery to be provided after elimination of the polarization of the battery.

The battery after the battery charging/discharging end time having a higher temperature causes the first time to be set to a time closer to the charging/discharging end time.

Alternatively, when the battery temperature after the battery charging/discharging end time is a second temperature higher than a first temperature, the first time is set to a time closer to the charging/discharging end time than the first time that would be set in a situation in which the battery temperature after the battery charging/discharging end time is the first temperature.

The battery after the battery charging/discharging end time having a higher temperature causes a shorter interval to be set between the first and second times. Alternatively, when the battery temperature after the battery charging/discharging end time is a second temperature higher than a fist temperature, the interval between the first and second times is set to an interval shorter than an interval that would be provided between the first and second times in a situation in which the battery temperature after the battery charging/discharging end time is the first temperature.

Advantageous Effects of Invention

The accuracy in estimation of an open-circuit voltage to be provided when polarization is eliminated can be increased.

BRIEF DESCRIPTION OF DRAWINGS

FIG. 1 illustrates an implementation of a power storage apparatus;

DESCRIPTION OF EMBODIMENTS

Figure 2:
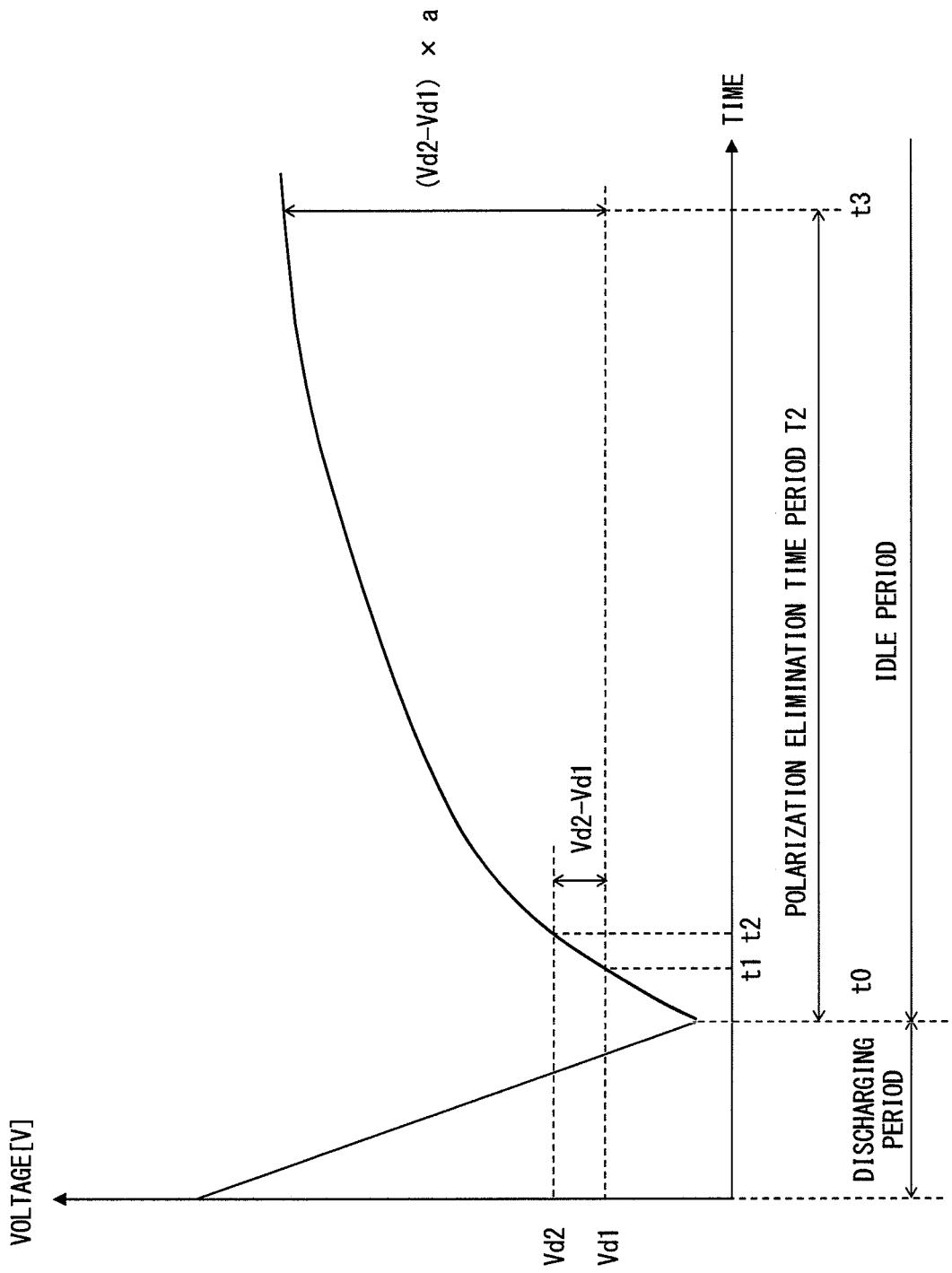
FIG. 2 illustrates a temporal change in a voltage that is seen during a discharging period and a polarization elimination time period after an end of discharging.

The following describes embodiments in detail on the basis of the drawings.

FIG. 1 illustrates an implementation of a power storage apparatus 1. The power storage apparatus 1 depicted in FIG. 1 is, for example, a battery pack and can possibly be installed in a vehicle. In this example, the power storage apparatus 1 includes an assembled battery 2 provided with one or more batteries 4, a control circuit 3 that controls the power storage apparatus 1, a voltmeter 5 that measures a voltage of the battery 4, an ammeter 6 that measures a current flowing through the assembled battery 2, and a thermometer 7 that measures the temperature of the assembled battery 2 or battery 4. The battery 4 of the assembled battery 2 is, for example, a rechargeable battery such as a nickel-hydrogen battery or a lithium-ion battery, or a power storage element.

The control circuit 3 controls the charging or discharging of the power storage apparatus 1 and the battery 4 and can be a circuit that uses, for example, a central processing unit (CPU), a multicore CPU, or a programmable device (e.g., field programmable gate array (FPGA), programmable logic device (PLD)). The control circuit 3 includes a storage part provided inside or outside thereof and reads and executes programs stored in the storage part for controlling components of the power storage apparatus 1. For this example, descriptions are given with reference to the control circuit 3. However, for example, one or more electronic control units (ECUs) installed in a vehicle may perform the control that would be performed by the control circuit 3.

During a polarization elimination time period extending from a charging/discharging end time of the battery 4 to a polarization-eliminated time at which polarization of the battery 4 can be judged to have been eliminated, the control circuit 3 obtains, as an amount of change, the difference between a voltage measured at a first time set according to the temperature of the battery 4 and a voltage measured at a second time following the first time and set according to the temperature of the battery 4, and sums the product of the amount of change and an estimation coefficient and the voltage measured at the first or second time so as to estimate an open-circuit voltage of the battery 4 to be provided after elimination of the polarization of the battery 4.

Figure 3:
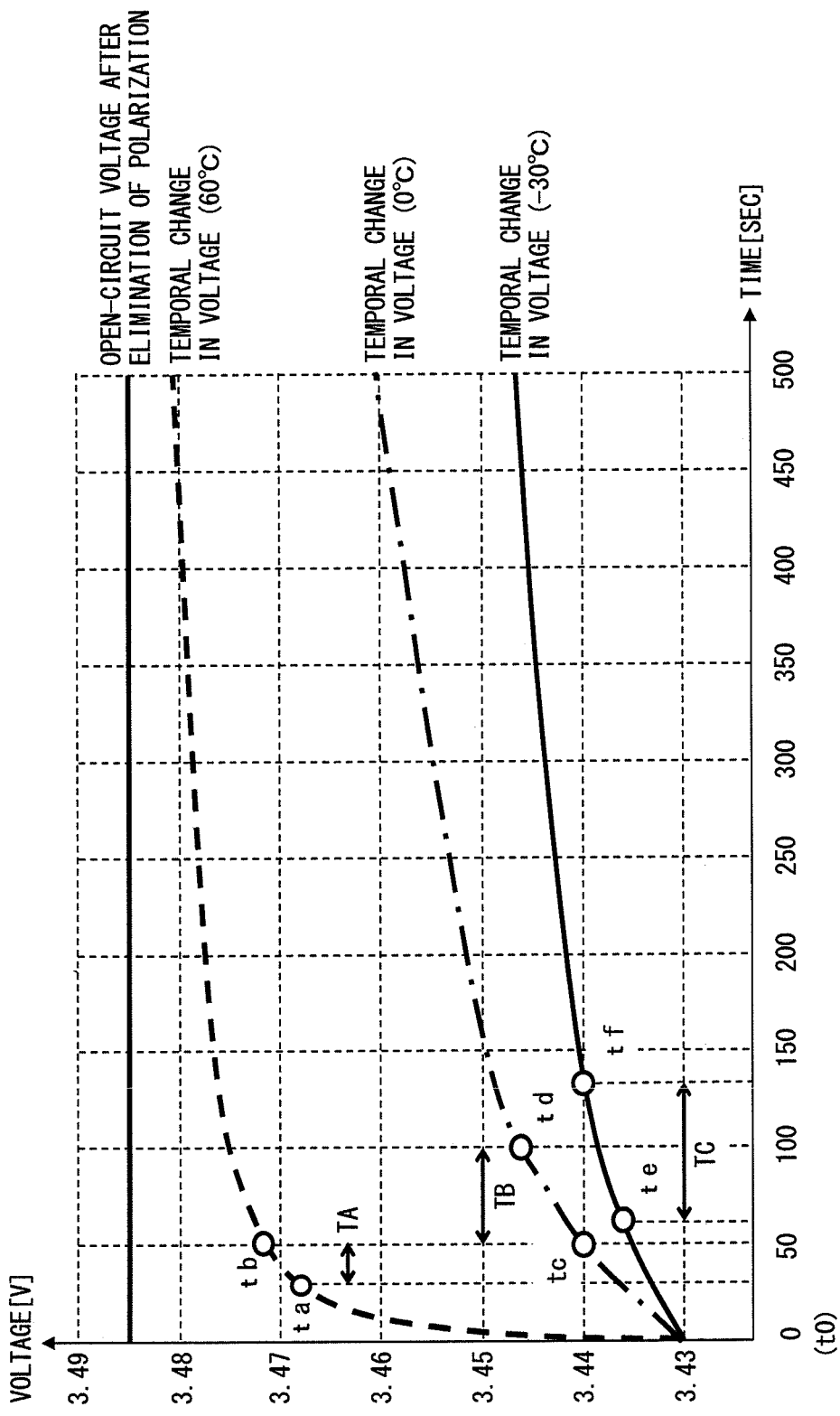
FIG. 3 illustrates, for some temperatures, temporal changes in voltages that are seen during a polarization elimination time period after an end of discharging.
Figure 4:
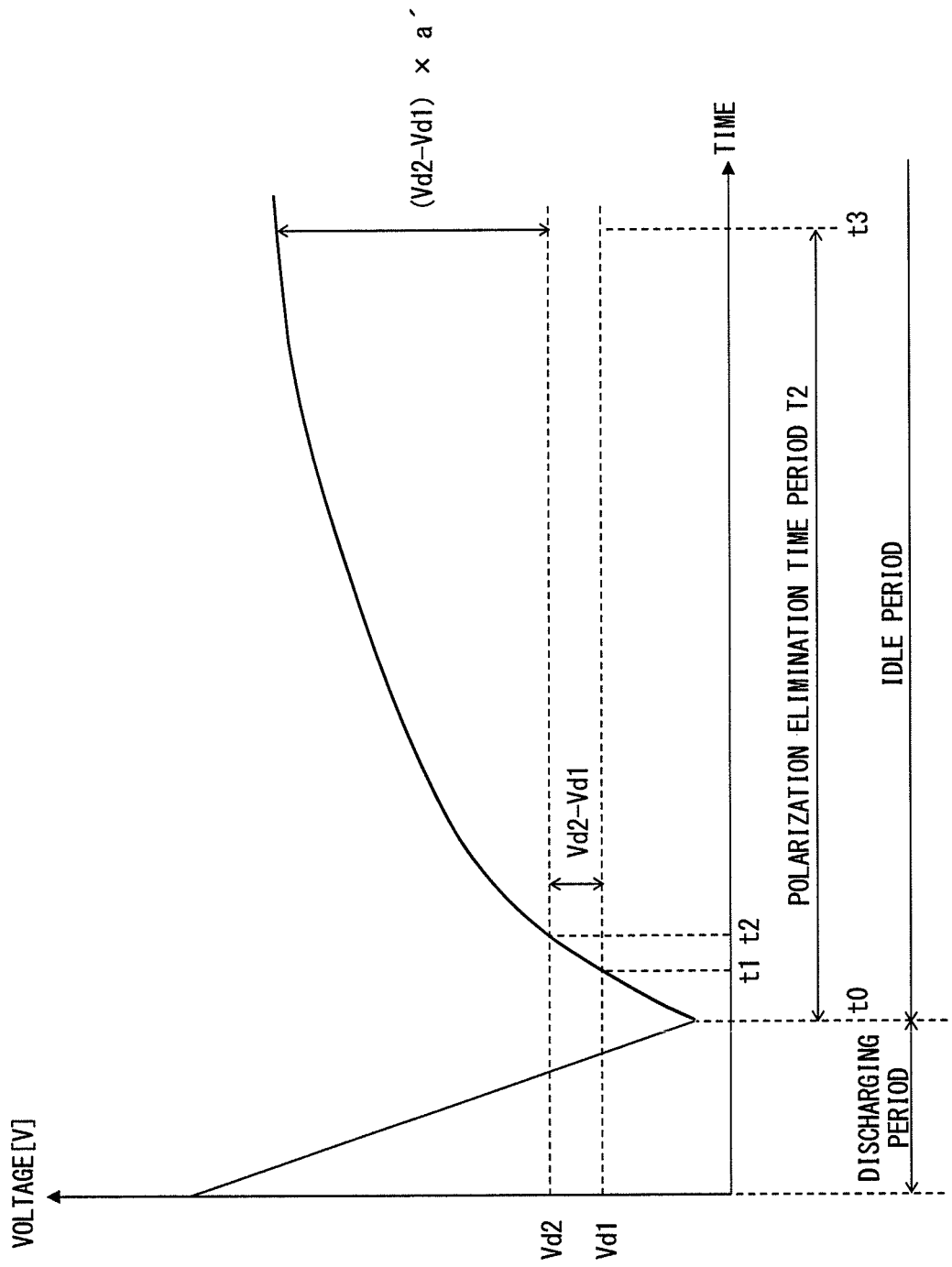
FIG. 4 illustrates a temporal change in a voltage that is seen during a discharging period and a polarization elimination time period after an end of discharging.
Figure 5:
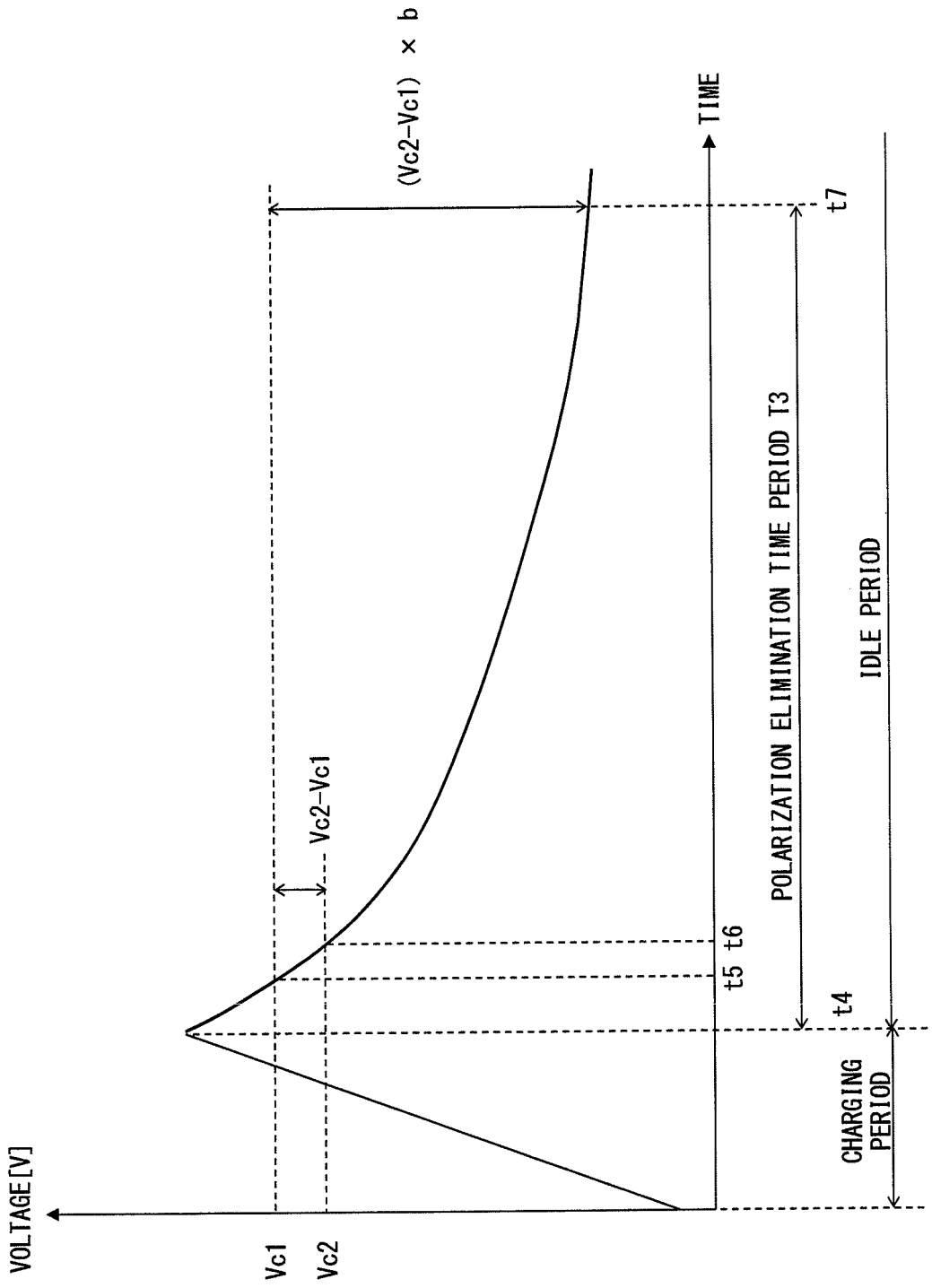
FIG. 5 illustrates a temporal change in a voltage that is seen during a charging period and a polarization elimination time period after an end of charging.
Figure 6:
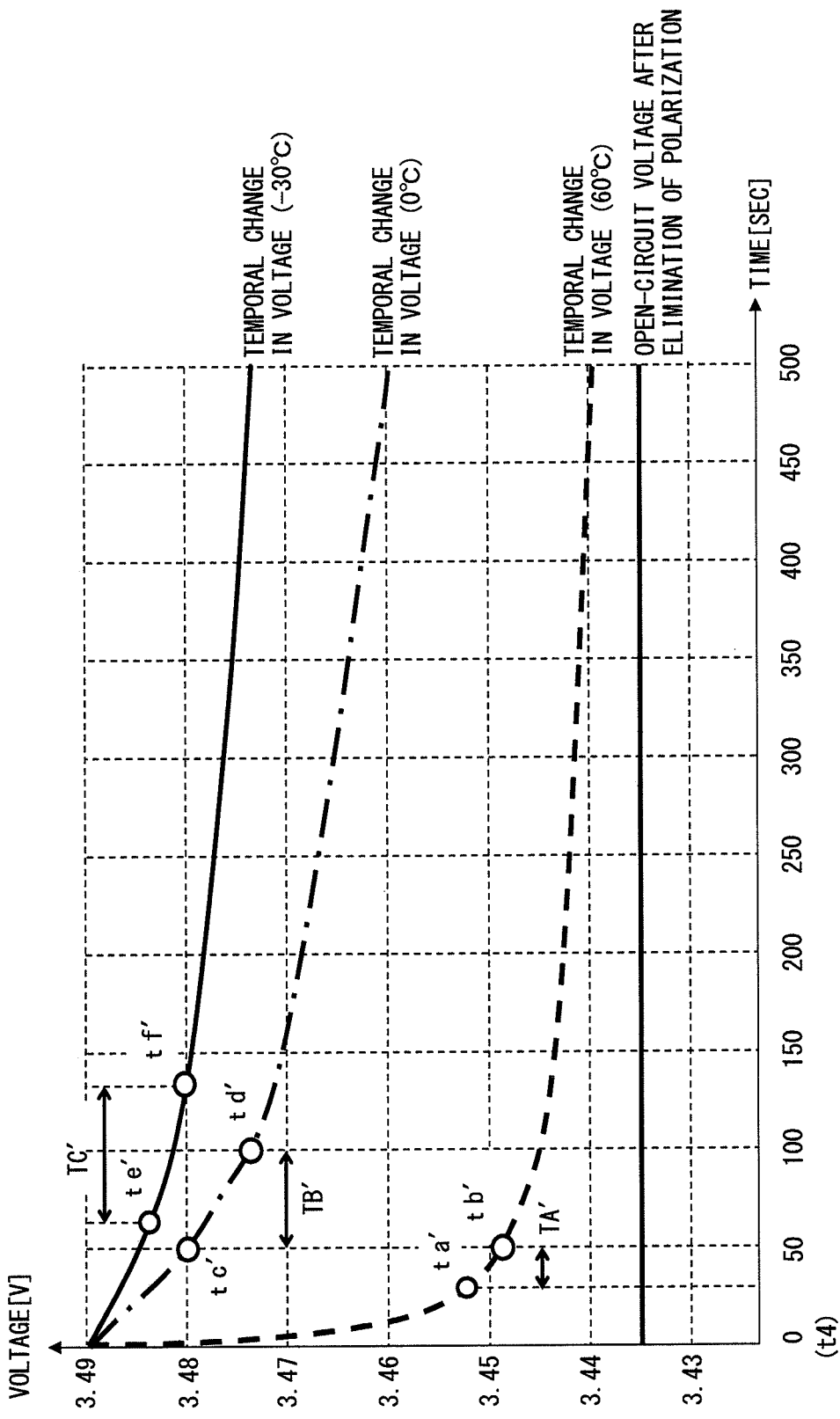
FIG. 6 illustrates, for some temperatures, temporal changes in voltages that are seen during a polarization elimination time period after an end of charging.
Figure 7:
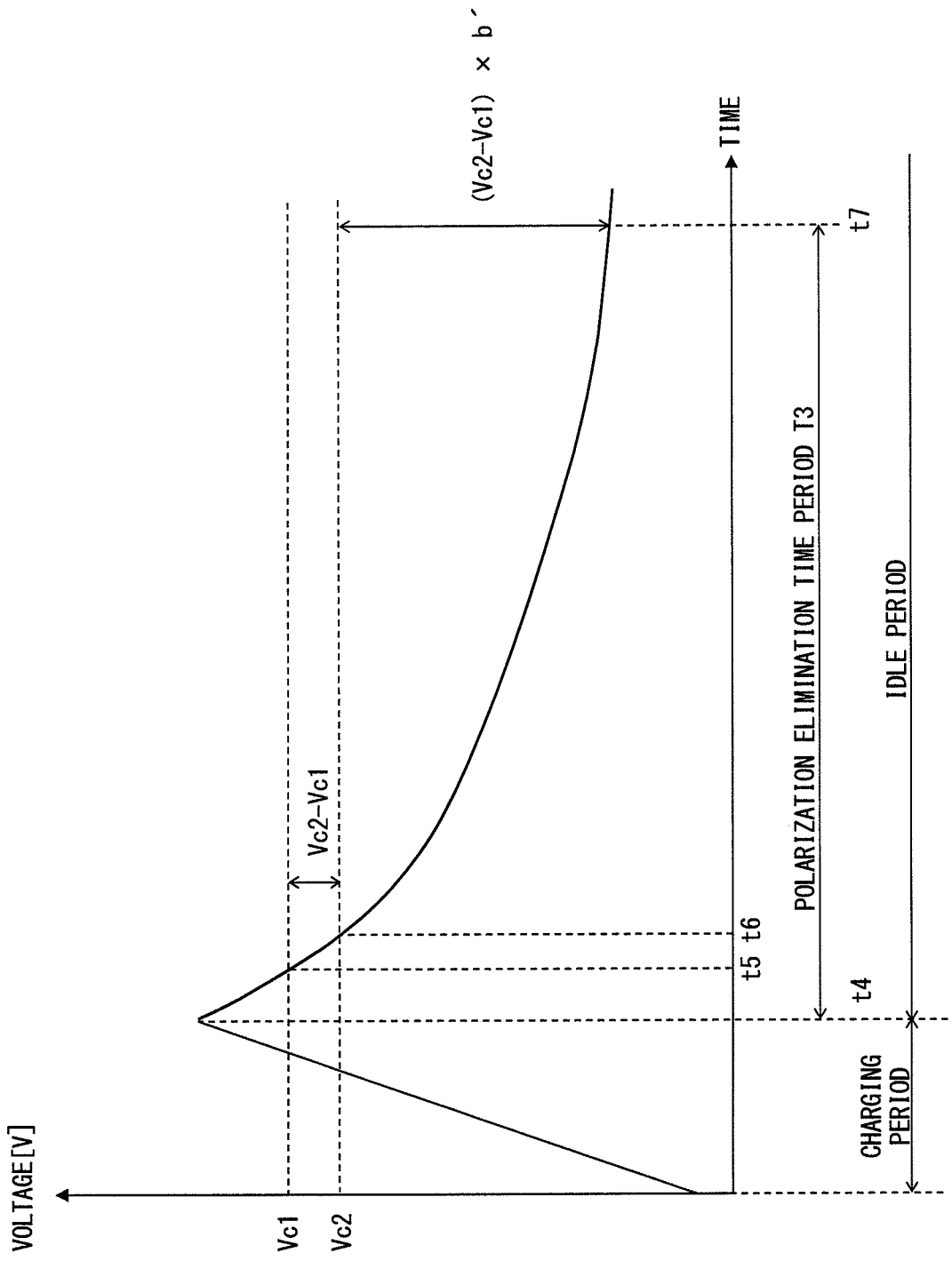
FIG. 7 illustrates a temporal change in a voltage that is seen during a charging period and a polarization elimination time period after an end of charging.

Next, by referring to FIGS. 2, 3, 4, 5, 6, and 7, descriptions are given of (A) the estimation of an open-circuit voltage to be provided after elimination of polarization that is performed before elimination of polarization after an end of discharging and (B) the estimation of an open-circuit voltage to be provided after elimination of polarization that is performed before elimination of polarization after an end of charging. FIG. 2 illustrates a temporal change in a voltage that is seen during a discharging period and a polarization elimination time period after an end of discharging. FIG. 3 illustrates, for some temperatures, temporal changes in voltages that are seen during a polarization elimination time period after an end of discharging. FIG. 4 illustrates a temporal change in a voltage that is seen during a discharging period and a polarization elimination time period after an end of discharging. FIG. 5 illustrates a temporal change in a voltage that is seen during a charging period and a polarization elimination time period after an end of charging. FIG. 6 illustrates, for some temperatures, temporal changes in voltages that are seen during a polarization elimination time period after an end of charging. FIG. 7 illustrates a temporal change in a voltage that is seen during a charging period and a polarization elimination time period after an end of charging. In FIGS. 2, 3, 4, 5, 6, and 7, a vertical axis indicates the voltage of the battery 4, and a horizontal axis indicates time.

(A) Estimation of estimated open-circuit voltage after end of discharging

After an end of the discharging of the battery 4, the control circuit 3 obtains, after a discharging end time t0 depicted in FIG. 2, a temperature of the battery 4 or assembled battery 2 measured by the thermometer 7 from the thermometer 7.

Next, the control circuit 3 refers to discharging temperature/time information by using the measured temperature so as to obtain a first time t1 and second time t2 correlated with the temperature. Discharging temperature/time information associates individual temperatures of the battery 4 after discharging with a first time t1 at which a first voltage Vd1 is measured and a second time t2 which follows the first time t1 and at which a second voltage Vd2 is measured. Discharging temperature/time information is stored in a storage part of the control circuit 3 or the like.

The voltage of the battery 4 is changed with temperature, and hence the length of polarization elimination time period T2 is varied with temperature. Polarization elimination time period T2 is a time period extending from discharging end time t0 to a polarization-eliminated time t3 at which polarization of the battery 4 can be judged to have been eliminated. As the temperature becomes higher, a chemical reaction occurs more easily within the battery 4, thereby eliminating polarization in a shorter time; as the temperature becomes lower, a chemical reaction becomes more difficult to occur within the battery 4, thereby eliminating polarization in a longer time. Accordingly, the battery 4 having a higher temperature causes the voltage of the battery 4 to become, in a shorter time after the discharging end time t0 of the battery 4, close to the open-circuit voltage to be provided after elimination of polarization; the battery 4 having a lower temperature causes the voltage of the battery 4 to become, at a longer time after the discharging end time t0 of the battery 4, close to the open-circuit voltage to be provided after elimination of polarization.

For example, as depicted in FIG. 3, when the temperature of the battery 4 is 60 [° C.], the voltage of the battery 4 becomes, at a time close to discharging end time t0, close to the open-circuit voltage to be provided after elimination of polarization; when the temperature of the battery 4 is 0 [° C.] or −30 [° C.], the temperature of the battery 4 becomes, at a time longer time after discharging end time t0 than in a situation in which the temperature of the battery 4 is 60 [° C.], close to the open-circuit voltage to be provided after elimination of polarization.

Accordingly, the battery 4 having a higher temperature causes the first time t1 to be set to a time shorter time after the discharging end time t0 of the battery 4; and the battery 4 having a lower temperature causes the first time t1 to be set to a time longer time after discharging end time t0. In other words, the first time with the battery 4 having a high temperature is closer to discharging end time t0 than the first time with the battery 4 having a low temperature is. In addition, after the discharging end time t0 of the battery 4, when the temperature of the battery 4 is a second temperature higher than a first temperature, the first time t1 is set to a time closer to discharging end time t0 than the first time t1 set in a situation in which the temperature of the battery 4 is the first temperature. In the example depicted in FIG. 3, when the temperature of the battery 4 is 60 [° C.], the first time t1 is set to time ta; when the temperature of the battery 4 is 0 [° C.], the first time t1 is set to time tc (>ta); when the temperature of the battery 4 is −30 [° C.], the first time t1 is set to time te (>tc>ta).

The battery 4 having a higher temperature causes the voltage of the battery 4 to be changed by a predetermined magnitude in a shorter time after the discharging end time t0 of the battery 4; when the temperature of the battery 4 is low, the voltage of the battery 4 is not changed by the predetermined magnitude in a short time after discharging end time t0. Accordingly, when the temperature of the battery 4 is low, the voltage change is small, and hence the voltage of the battery 4 would not be changed by the predetermined magnitude without the elapse of a long period of time. For example, as depicted in FIG. 3, when the temperature of the battery 4 is 60 [° C.], the voltage of the battery 4 is changed by a predetermined magnitude during a period TA (a period extending from time ta to time tb) that is close to discharging end time t0; when the temperature of the battery 4 is 0 [° C.], the voltage of the battery 4 is changed by the predetermined magnitude during a period TB (a period extending from time tc to time td, i.e., a period longer than period TA); when the temperature of the battery 4 is −30 [° C.], the voltage of the battery 4 is changed by the predetermined magnitude during a period TC (a period extending from time te to time tf, i.e., a period longer than periods TA and TB). Periods TA, TB, and TC are each, for example, a period during which an amount of change indicating a voltage change of the predetermined magnitude (Vd2−Vd1) can be obtained.

Accordingly, after the discharging end time t0 of the battery 4, the battery 4 having a higher temperature causes a shorter interval to be set between a first time t1 and a second time t2; the battery 4 having a lower temperature causes a longer interval to be set between the first time t1 and the second time t2. In other words, the interval between the first and second times with the battery 4 having a high temperature is set to an interval shorter than the interval between the first and second times with the battery 4 having a low temperature. In addition, after the discharging end time t0 of the battery 4, the interval between the first time t1 and the second time t2 with the battery 4 having a second temperature higher than a first temperature is set to an interval shorter than the interval between the first time t1 and the second time t2 with the battery 4 having the first temperature. In the example depicted in FIG. 3, when the temperature of the battery 4 is 60 [° C.], the second time t2 is set to a time tb at which a predetermined amount of voltage change is achieved; when the temperature of the battery 4 is 0 [° C.], the second time t2 is set to a time td (>tb) at which the predetermined amount of voltage change is achieved; when the temperature of the battery 4 is −30 [° C.], the second time t2 is set to a time tf (>td>tb) at which the predetermined amount of voltage change is achieved.

Next, as depicted in FIG. 2, the control circuit 3 obtains, as an amount of change (Vd2−Vd1), the difference between a voltage Vd1 measured at a first time t1 set according to the temperature and a voltage Vd2 measured at a second time t2 following the first time t1 and set according to the temperature of the battery 4 and sums the product of the amount of change and an estimation coefficient a and the voltage measured at the first time so as to estimate an open-circuit voltage OCV1 of the battery 4 to be provided after elimination of polarization of the battery 4. See formula 1.

$$OCV1 = Vd1 + (Vd2 - Vd1) \times a \qquad \text{(Formula 1)}$$

The estimation coefficient a is determined in advance on the basis of an accurate open-circuit voltage OCV2 measured after the elapse of polarization elimination time period T2 (after elimination of polarization) prior to the current discharging end time t0. See formula 2.

$$a = (OCV2 - Vd1)/(Vd2 - Vd1) \qquad \text{(Formula 2)}$$

Alternatively, as depicted in FIG. 4, the control circuit 3 obtains, as an amount of change (Vd2−Vd1), the difference between a voltage Vd1 measured at a first time t1 set according to the temperature and a voltage Vd2 measured at a second time t2 following the first time t1 and set according to the temperature of the battery 4 and sums the product of the amount of change and an estimation coefficient a' and the voltage Vd2 measured at the second time t2 so as to estimate an open-circuit voltage OCV1 of the battery 4 to be provided after elimination of polarization of the battery 4. See formula 1'.

$$OCV1 = Vd2 + (Vd2 - Vd1) \times a' \qquad \text{(Formula 1')}$$

The estimation coefficient a' is determined in advance on the basis of an accurate open-circuit voltage OCV2 measured after the elapse of polarization elimination time period T2 (after elimination of polarization) prior to the current discharging end time t0. See formula 2'.

$$a' = (OCV2 - Vd2)/(Vd2 - Vd1) \qquad \text{(Formula 2')}$$

The determined estimation coefficient a or a' may be changed using at least one of the temperature, state of charge, and degree of deterioration of the battery 4.

An accurate open-circuit voltage OCV1 can be estimated as described above even before polarization is eliminated after discharging has been ended.

An accurate open-circuit voltage OCV1 can be used so that the state of charge (SOC) of the battery 4 can be accurately determined in a polarization elimination time period.

(B) Estimation of estimated open-circuit voltage after end of charging

After an end of the charging of the battery 4, the control circuit 3 obtains, after a charging end time t4 depicted in FIG. 5, a temperature of the battery 4 or assembled battery 2 measured by the thermometer 7 from the thermometer 7.

Next, the control circuit 3 refers to charging temperature/time information by using the measured temperature so as to obtain a first time t5 and second time t6 correlated with the temperature. Charging temperature/time information associates individual temperatures of the battery 4 after charging with a first time t5 at which a first voltage Vc1 is measured and a second time t6 which follows the first time t5 and at which a second voltage Vc2 is measured. Charging temperature/time information is stored in a storage part of the control circuit 3 or the like.

The voltage of the battery 4 is changed with temperature, and hence the length of polarization elimination time period T3 is different for each temperature. Polarization elimination time period T3 is a time period extending from charging end time t4 to a polarization-eliminated time t7 at which polarization of the battery 4 can be judged to have been eliminated. As the temperature becomes higher, a chemical reaction occurs more easily within the battery 4, thereby eliminating polarization in a shorter time; as the temperature becomes lower, a chemical reaction becomes more difficult to occur within the battery 4, thereby eliminating polarization in a longer time. Accordingly, the battery 4 having a higher temperature causes the voltage of the battery 4 to become, in a shorter time after the charging end time t4 of the battery 4, close to the open-circuit voltage to be provided after elimination of polarization; the battery 4 having a lower temperature causes the voltage of the battery 4 to become, at a longer time after the charging end time t4 of the battery 4, close to the open-circuit voltage to be provided after elimination of polarization. For example, as depicted in FIG. 6, when the temperature of the battery 4 is 60 [° C.], the voltage of the battery 4 becomes, at a time close to charging end time t4, close to the open-circuit voltage to be provided after elimination of polarization; when the temperature of the battery 4 is 0 [° C.] or −30 [° C.], the temperature of the battery 4 becomes, at a time longer time after charging end time t4 than in a situation in which the temperature of the battery 4 is 60 [° C.], close to the open-circuit voltage to be provided after elimination of polarization.

Accordingly, the battery 4 having a higher temperature causes the first time t5 to be set to a time shorter time after the charging end time t4 of the battery 4; the battery 4 having a lower temperature causes the first time t5 to be set to a time longer time after charging end time t4. In other words, the first time with the battery 4 having a high temperature is closer to charging end time t4 than the first time with the battery 4 having a low temperature is. In addition, after the charging end time t4 of the battery 4, when the temperature of the battery 4 is a second temperature higher than a first temperature, the first time t5 is set to a time closer to charging end time t4 than the first time t5 set in a situation in which the temperature of the battery 4 is the first temperature. In the example depicted in FIG. 6, when the temperature of the battery 4 is 60 [° C.], the first time t5 is set to time ta'; when the temperature of the battery 4 is 0 [° C.], the first time t5 is set to time tc' (>ta'); when the temperature of the battery 4 is −30 [° C.], the first time t5 is set to time te' (>tc'>ta').

As the temperature of the battery 4 becomes higher, the voltage of the battery 4 is changed by a predetermined magnitude in a shorter time after the charging end time t4 of the battery 4; when the temperature of the battery 4 is low, the voltage of the battery 4 is not changed by the predetermined magnitude in a short time after charging end time t4. Accordingly, when the temperature of the battery 4 is low, the voltage change is small, and hence the voltage of the battery 4 would not be changed by the predetermined magnitude without the elapse of a long period of time. For example, as depicted in FIG. 6, when the temperature of the battery 4 is 60 [° C.], the voltage of the battery 4 is changed by a predetermined magnitude during a period TA' (a period extending from time ta' to time tb') that is close to charging end time t4; when the temperature of the battery 4 is 0 [° C.], the voltage of the battery 4 is changed by the predetermined magnitude during a period TB' (a period extending from time tc' to time td', i.e., a period longer than period TA'); when the temperature of the battery 4 is −30 [° C.], the voltage of the battery 4 is changed by the predetermined magnitude during a period TC' (a period extending from time te' to time tf', i.e., a period longer than periods TA' and TB'). Periods TA', TB', and TC' are each, for example, a period during which an amount of change indicating a voltage change of the predetermined magnitude (Vc2−Vc1) can be obtained.

Accordingly, after the charging end time t4 of the battery 4, the battery 4 having a higher temperature causes a shorter interval to be set between a first time t5 and a second time t6; the battery 4 having a lower temperature causes a longer interval to be set between the first time t5 and the second time t6. In other words, the interval between the first and second times with the battery 4 having a high temperature is set to an interval shorter than the interval between the first and second times with the battery 4 having a low temperature. In addition, after the charging end time t4 of the battery 4, the interval between the first time t5 and the second time t6 with the battery 4 having a second temperature higher than a first temperature is set to an interval shorter than the interval between the first time t5 and the second time t6 with the battery 4 having the first temperature. In the example depicted in FIG. 6, when the temperature of the battery 4 is 60 [° C.], the second time t6 is set to a time tb' at which a predetermined amount of voltage change is achieved; when the temperature of the battery 4 is 0 [° C.], the second time t6 is set to a time td' (>tb') at which the predetermined amount of voltage change is achieved; when the temperature of the battery 4 is −30 [° C.], the second time t6 is set to a time tf' (>td'>tb') at which the predetermined amount of voltage change is achieved.

Next, as depicted in FIG. 5, the control circuit 3 obtains, as an amount of change (Vc2−Vc1), the difference between a voltage Vc1 measured at a first time t5 set according to the temperature and a voltage Vc2 measured at a second time t6 following the first time t5 and set according to the temperature of the battery 4 and sums the product of the amount of change and an estimation coefficient b and the voltage measured at the first time t5 so as to estimate an open-circuit voltage OCV1 of the battery 4 to be provided after elimination of polarization of the battery 4. See formula 3.

$$OCV1 = Vc1 + (Vc2 - Vc1) \times b \quad \text{(Formula 3)}$$

The estimation coefficient b is determined in advance on the basis of an accurate open-circuit voltage OCV2 measured after the elapse of polarization elimination time period T3 (after elimination of polarization) prior to the current charging end time t4. See formula 4.

$$b = (OCV2 - Vc1)/(Vc2 - Vc1) \quad \text{(Formula 4)}$$

Alternatively, as depicted in FIG. 7, the control circuit 3 obtains, as an amount of change (Vc2−Vc1), the difference between a voltage Vc1 measured at a first time t5 set according to the temperature and a voltage Vc2 measured at a second time t6 following the first time t5 and set according to the temperature of the battery 4 and sums the product of the amount of change and an estimation coefficient b' and the voltage Vc2 measured at the second time t6 so as to estimate an open-circuit voltage OCV1 of the battery 4 to be provided after elimination of polarization of the battery 4. See formula 3'.

$$OCV1 = Vc2 + (Vc2 - Vc1) \times b' \quad \text{(Formula 3')}$$

The estimation coefficient b' is determined in advance on the basis of an accurate open-circuit voltage OCV2 measured after the elapse of polarization elimination time period T3 (after elimination of polarization) prior to the current charging end time t4. See formula 4'.

$$b' = (OCV2 - Vc2)/(Vc2 - Vc1) \quad \text{(Formula 4')}$$

The determined estimation coefficient b or b' may be changed using at least one of the temperature, state of charge, and degree of deterioration of the battery 4.

An accurate open-circuit voltage OCV1 can be estimated as described above even before polarization is eliminated after charging has been ended.

An accurate open-circuit voltage OCV1 can be used so that the state of charge of the battery 4 can be accurately determined in a polarization elimination time period.

(C) Operation of Power Storage Apparatus

Figure 8:
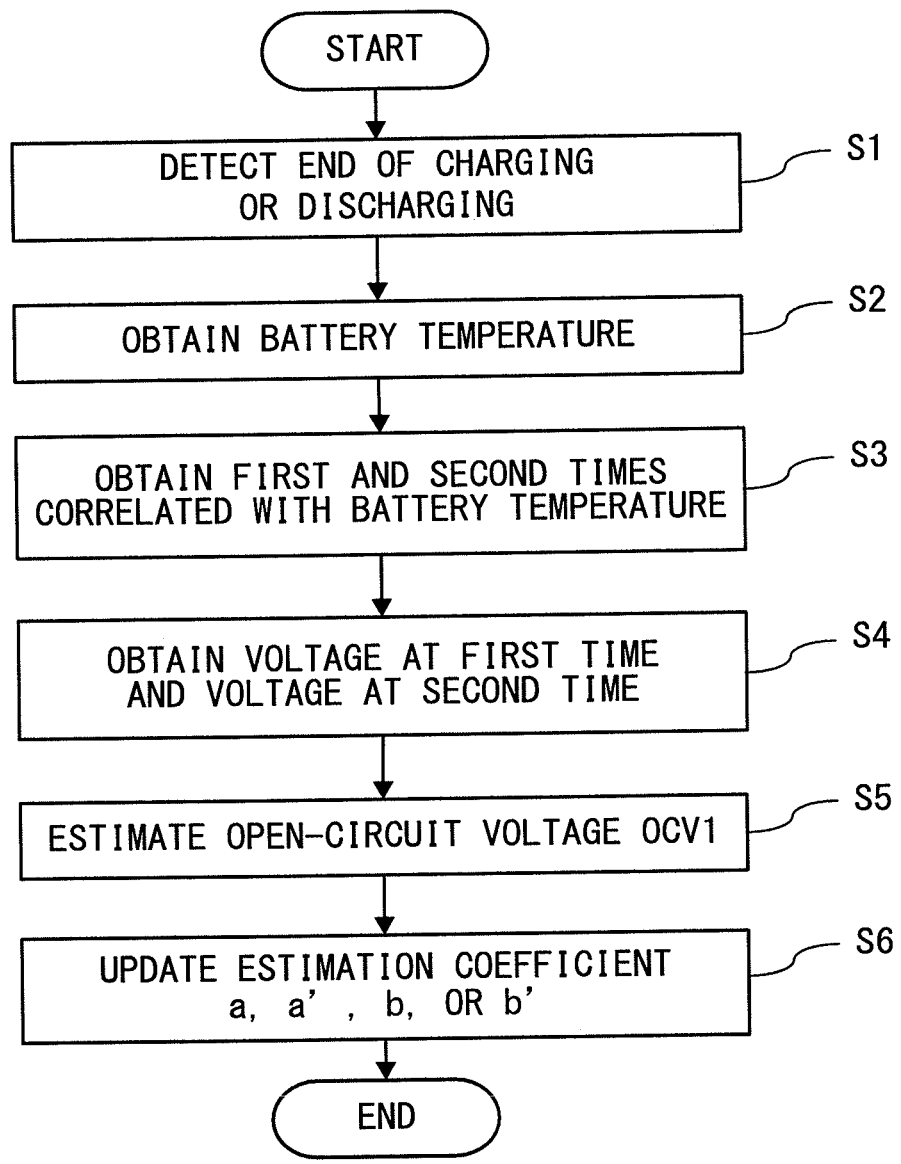
FIG. 8 is a flow diagram illustrating an implementation of an operation of a power storage apparatus.

FIG. 8 is a flow diagram illustrating an implementation of an operation of the power storage apparatus 1.

In step S1, the control circuit 3 detects that the charging or discharging of the battery 4 has been ended.

In step S2, the control circuit 3 obtains the temperature of the battery 4 from the thermometer 7.

In step S3, the control circuit 3 obtains first and second times correlated with the temperature of the battery 4. In a situation after the end of discharging, a first time t1 and a second time t2 are obtained using discharging temperature/time information. In a situation after the end of charging, a first time t5 and a second time t6 are obtained using charging temperature/time information.

After the charging/discharging end time of the battery 4, the battery 4 having a higher temperature causes the first time to be set to a time closer to the charging/discharging end time. In addition, after the charging/discharging end time of the battery 4, the battery 4 having a higher temperature causes a shorter interval to be set between the first and second times.

In step S4, the control circuit 3 obtains voltage Vd1 (Vc1 in a situation after charging) at the first time and obtains voltage Vd2 (Vc2 in a situation after charging) at the second time.

In step S5, during a polarization elimination time period extending from a charging/discharging end time of the battery 4 (t0 in FIG. 2 or t4 in FIG. 5) to a polarization-eliminated time at which polarization of the battery 4 can be judged to have been eliminated (t3 in FIG. 2 or t7 in FIG. 5), the control circuit 3 obtains, as an amount of change (Vd2−Vd1) (Vc2−Vc1 in a situation after charging), the difference between a voltage Vd1 (Vc1 in a situation after charging) measured at a first time set according to the temperature of the battery 4 and a voltage Vd2 (Vc2 in a situation after charging) measured at a second time following the first time and set according to the temperature of the battery 4, and sums the product of the amount of change and an estimation coefficient (a in formula 1 or b in formula 3) and the voltage Vd1 (Vc1 in a situation after charging) measured at the first time so as to estimate an open-circuit voltage OCV1 of the battery 4 to be provided after elimination of the polarization of the battery 4. In particular, open-circuit voltage OCV1 is estimated using formula 1 or 3.

Alternatively, in step S5, during a polarization elimination time period extending from a charging/discharging end time of the battery 4 (t0 in FIG. 2 or t4 in FIG. 5) to a polarization-eliminated time at which polarization of the battery 4 can be judged to have been eliminated (t3 in FIG. 2 or t7 in FIG. 5), the control circuit 3 obtains, as an amount of change (Vd2−Vd1) (Vc2−Vc1 in a situation after charging), the difference between a voltage Vd1 (Vc1 in a situation after charging) measured at a first time set according to the temperature of the battery 4 and a voltage Vd2 (Vc2 in a situation after charging) measured at a second time following the first time and set according to the temperature of the battery 4, and sums the product of the amount of change and an estimation coefficient (a' in formula 1' or b' in formula 3') and the voltage Vd2 (Vc2 in a situation after charging) measured at the second time so as to estimate an open-circuit voltage OCV1 of the battery 4 to be provided after elimination of the polarization of the battery 4. In particular, open-circuit voltage OCV1 is estimated using formula 1' or 3'.

In step S6, the control circuit 3 updates the estimation coefficient (a in formula 2, a' in formula 2', b in formula 4, or b' in formula 4') using an open-circuit voltage OCV2 measured after the elapse of the polarization elimination time period (T2 in FIG. 2 or T3 in FIG. 5). In particular, the estimation coefficient is updated using formula 2, 2', 4, or 4'.

An accurate open-circuit voltage OCV1 can be estimated as described above even before polarization is eliminated after charging or discharging has been ended.

An accurate open-circuit voltage OCV1 can be used so that the state of charge of the battery 4 can be accurately determined in a polarization elimination time period.

After the charging/discharging end time of the battery 4, setting the first time to a time closer to the charging/discharging end time as the temperature of the battery 4 is higher or setting a shorter interval between the first and second times as the temperature of the battery 4 is higher allows the open-circuit voltage OCV1 of the battery 4 to be estimated quickly.

When the temperature of the battery 4 is high while the ambient temperature is ordinary, the battery 4 is likely to have been deteriorated. Accordingly, estimating open-circuit voltage OCV1 quickly allows a state of charge, degree of deterioration, abnormality in the battery, or the like to be identified quickly.

The first time does not need to be varied according to temperature. For example, an identical time may be set as the first time for 0 [° C.] and −30 [° C.].

The interval between the first and second times does not need to be varied according to temperature. For example, an identical interval may be set as the interval between the first and second times for 0 [° C.] and −30 [° C.].

In particular, the control circuit 3 may be configured in a manner such that when the interval between the first and second times with the battery 4 having a high temperature after the charging/discharging end time of the battery 4 is set to an interval shorter than the interval between the first and second times with the battery 4 having a low temperature, the first time with the battery 4 having a high temperature and the first time with the battery 4 having a low temperature are set to an identical time.

Alternatively, the control circuit 3 may be configured in a manner such that when the first time with the battery 4 having a high temperature after the charging/discharging end time of the battery 4 is set to a time closer to the charging/discharging end time than the first time with the battery 4 having a low temperature, the interval between the first and second times with the battery 4 having a high temperature and the interval between the first and second times with the battery 4 having a low temperature are set to an identical interval.

The configuration described above also allows open-circuit voltage OCV1 to be estimated in a shorter time as the temperature of the battery 4 is higher, so that the state of charge and degree of deterioration of the battery 4, an abnormality in the battery 4, or the like can be identified in a shorter time.

The present invention is not limited to the embodiments described above and can be variously modified or changed without departing from the gist of the invention.

EXPLANATION OF THE CODES

1: Power storage apparatus
2: Assembled battery
3: Control circuit
4: Battery
5: Voltmeter
6: Ammeter
7: Thermometer

The invention claimed is:
1. A power storage apparatus, comprising:
a battery;
a thermometer that measures a temperature of the battery; and
a control circuit, including a storage storing charging/discharging temperature/time information, that controls charging or discharging of the battery,
wherein the battery having a higher temperature causes a voltage of the battery to become, in a shorter time after a charging/discharging end time, close to an open-circuit voltage of the battery to be provided after an elimination of polarization, and the battery having a lower temperature causes the voltage of the battery to become, in a longer time after the charging/discharging end time, close to the open-circuit voltage of the battery to be provided after the elimination of polarization,
wherein the control circuit causes the thermometer to measure the temperature of the battery at a detected battery charging/discharging end time,
wherein the control circuit determines a first time and a second time following the first time, by referring to the measured temperature of the battery and the stored charging/discharging temperature/time information that associates the measured temperature of the battery, the first time, and the second time, wherein during a polarization elimination time period, extending from the battery charging/discharging end time to a polarization-eliminated time at which polarization of the battery is judged to have been eliminated, the control circuit determines, as an amount of change, a difference between a voltage measured at the first time set according to the measured temperature of the battery and the stored charging/discharging temperature/time information, and a voltage measured at the second time set according to the measured temperature of the battery and the stored charging/discharging temperature/time information, and sums a product of the amount of change, an estimation coefficient, and the voltage measured at the first time or the second time so as to estimate the open-circuit voltage of the battery to be provided after the elimination of the polarization of the battery, and wherein the battery after the battery charging/discharging end time having a higher temperature causes a shorter interval to be set between the first time and the second time.

2. The power storage apparatus of claim 1,
wherein the battery after the battery charging/discharging end time having a higher temperature causes the first time to be set to a time closer to the charging/discharging end time.

3. The power storage apparatus of claim 1,
wherein an amount of voltage change made during the interval between the first time and the second time when the temperature of the battery is high is equal to an amount of voltage change that would be made during the interval between the first time and the second time in a situation in which the temperature of the battery is low.

4. The power storage apparatus of claim 1,
wherein the battery having a higher temperature causes the voltage of the battery to be changed by a predetermined magnitude in a shorter time after the charging/discharging end time, and
the battery having a lower temperature causes the voltage of the battery to be changed by the predetermined magnitude in a longer time after the charging/discharging end time.

5. The power storage apparatus of claim 3,
wherein the control circuit measures voltages at the first time and the second time.

6. A power storage apparatus, comprising:
a battery;
a thermometer that measures a temperature of the battery; and
a control circuit, including a storage storing charging/discharging temperature/time information, that controls charging or discharging of the battery,
wherein the battery having a higher temperature causes a voltage of the battery to become, in a shorter time after a charging/discharging end time, close to an open-circuit voltage of the battery to be provided after an elimination of polarization, and the battery having a lower temperature causes the voltage of the battery to become, in a longer time after the charging/discharging end time, close to the open-circuit voltage of the battery to be provided after the elimination of polarization, wherein the control circuit causes the thermometer to measure the temperature of the battery at a detected battery charging/discharging end time, wherein the control circuit determines a first time and a second time following the first time, by referring to the measured temperature of the battery and the stored charging/discharging temperature/time information that associates the measured temperature of the battery, the first time, and the second time, and wherein during a polarization elimination time period, extending from the battery charging/discharging end time to a polarization-eliminated time at which polarization of the battery is judged to have been eliminated, the control circuit determines, as an amount of change, a difference between a voltage measured at the first time set according to the measured temperature of the battery and the stored charging/discharging temperature/time information, and a voltage measured at the second time set according to the measured temperature of the battery and the stored charging/discharging temperature/time information, and sums a product of the amount of change, an estimation coefficient, and the voltage measured at the first time or the second time so as to estimate the open-circuit voltage of the battery to be provided after the elimination of the polarization of the battery, wherein when the temperature of the battery after the battery charging/discharging end time is a second temperature higher than a first temperature, an interval between the first time and the second time is set to an interval shorter than an interval that would be provided between the first and second times in a situation in which the temperature of the battery after the battery charging/discharging end time is the first temperature.

7. The power storage apparatus of claim 6,
wherein when the temperature of the battery after the battery charging/discharging end time is a second temperature higher than a first temperature, the first time is set to a time closer to the charging/discharging end time than the first time that would be set in a situation in which the temperature of the battery after the battery charging/discharging end time is the first temperature.

8. The power storage apparatus of claim 6,
wherein an amount of voltage change made during the interval between the first time and the second time when the temperature of the battery is the second temperature is equal to an amount of voltage change that would be made during the interval between the first time and the second time in a situation in which the temperature of the battery is the first temperature.

9. The power storage apparatus of claim 6,
wherein when the temperature of the battery is the first temperature, the voltage of the battery is changed by a predetermined magnitude in a predetermined time, and
when the temperature of the battery is the second temperature, the voltage of the battery is changed by the predetermined magnitude in a shorter time after the charging/discharging end time than the predetermined time.

* * * * *